(12) United States Patent
Guo et al.

(10) Patent No.: US 12,183,294 B1
(45) Date of Patent: Dec. 31, 2024

(54) LED DIRECT-VIEW PROJECTION ARRAY LIGHT-EMITTING MODULE AND DISPLAY SCREEN

(71) Applicant: YUANXU SEMICONDUCTOR TECHNOLOGY (WUXI) CO., LTD, Wuxi (CN)

(72) Inventors: Wenping Guo, Wuxi (CN); Qunxiong Deng, Wuxi (CN); Kui Han, Wuxi (CN); Shunrong Wang, Wuxi (CN)

(73) Assignee: YUANXU SEMICONDUCTOR TECHNOLOGY (WUXI) CO., LTD, Wuxi (CN)

( * ) Notice: Subject to any disclaimer, the term of this patent is extended or adjusted under 35 U.S.C. 154(b) by 0 days.

(21) Appl. No.: 18/805,242

(22) Filed: Aug. 14, 2024

Related U.S. Application Data

(63) Continuation of application No. PCT/CN2024/086516, filed on Apr. 8, 2024.

(30) Foreign Application Priority Data

Jun. 28, 2023 (CN) .......................... 202310775705.X

(51) Int. Cl.
*G09G 3/34* (2006.01)
*H01L 25/18* (2023.01)
*H01L 27/15* (2006.01)

(52) U.S. Cl.
CPC .......... *G09G 3/3413* (2013.01); *H01L 25/18* (2013.01); *H01L 27/156* (2013.01); *G09G 2300/0465* (2013.01)

(58) Field of Classification Search
CPC .. G02B 3/0081; G02B 25/002; G02B 27/025; G02B 13/26; G03B 21/20
See application file for complete search history.

(56) References Cited

U.S. PATENT DOCUMENTS 5,743,614 A * 4/1998 Salerno ................ H01L 27/156
348/E5.145
7,075,501 B1 * 7/2006 Spitzer .............. G02F 1/133526
257/E29.295

(Continued)

FOREIGN PATENT DOCUMENTS

CN 101371573 A 2/2009
CN 101930155 A 12/2010

(Continued)

OTHER PUBLICATIONS

International Search Report issued in corresponding PCT Application No. PCT/CN2024/086516, dated May 22, 2024.

(Continued)

*Primary Examiner* — Vinh T Lam
(74) *Attorney, Agent, or Firm* — Westbridge IP LLC

(57) ABSTRACT

Disclosed are an LED direct-view projection array light-emitting module and a display screen. The light-emitting module includes a video decoding drive board, a display unit drive board, display units, and an imaging unit from the bottom up. The present disclosure uses a semiconductor technology to integrate and miniaturize light sources that emit light actively to obtain integrated LED array chips as light-emitting sources, directly controls the light-emitting sources through a circuit, then uses magnification objective lenses to perform a certain magnification according to an application scenario requirement, and then focuses on and image each pixel by using a focusing lens. Through a combination of the magnification lenses and the focusing lenses, when the light source intensity is sufficient, products of various sizes can be designed; when splicing into a large screen, splicing angles can be adjusted arbitrarily to realize a flexible screen or a special-shaped screen.

9 Claims, 5 Drawing Sheets

(56) References Cited

U.S. PATENT DOCUMENTS

| | | | | |
|---|---|---|---|---|
| 8,259,048 | B2* | 9/2012 | Yamazaki | G09G 3/3406 |
| | | | | 345/87 |
| 9,522,527 | B2* | 12/2016 | Clark | B41J 2/2142 |
| 11,107,957 | B2* | 8/2021 | Xie | H01L 33/54 |
| 2023/0157132 | A1* | 5/2023 | He | G02B 30/26 |
| | | | | 257/40 |
| 2024/0065077 | A1* | 2/2024 | Nakamura | H05B 33/02 |
| 2024/0161695 | A1* | 5/2024 | Ito | H04N 5/70 |
| 2024/0179987 | A1* | 5/2024 | Ito | G09G 3/3233 |
| 2024/0196653 | A1* | 6/2024 | Okamoto | G09G 3/20 |

FOREIGN PATENT DOCUMENTS

| | | |
|---|---|---|
| CN | 103927943 A | 7/2014 |
| CN | 104464536 A | 3/2015 |
| CN | 109597274 A | 4/2019 |
| CN | 209606761 U | 11/2019 |
| CN | 110855968 A | 2/2020 |
| CN | 110998434 A | 4/2020 |
| CN | 112530302 A | 3/2021 |
| CN | 113640988 A | 11/2021 |
| CN | 114093907 A | 2/2022 |
| JP | H0457011 A | 2/1992 |
| JP | 2006285012 A | 10/2006 |

OTHER PUBLICATIONS

Written Opinion issued in corresponding PCT Application No. PCT/CN2024/086516, dated May 22, 2024.

* cited by examiner

LED DIRECT-VIEW PROJECTION ARRAY LIGHT-EMITTING MODULE AND DISPLAY SCREEN

CROSS-REFERENCE TO RELATED APPLICATIONS

The present is a continuation of International Application No. PCT/CN2024/086516, filed on Apr. 8, 2024, which claims priority to Chinese Patent Application No. 202310775705.X, filed with the Chinese Patent Office on Jun. 28, 2023, and entitled "LED Direct-view Projection Array Light-emitting Module and Display Screen". All of the aforementioned applications are incorporated herein by reference in their entireties.

TECHNICAL FIELD

The application belongs to the field of display technologies, and in particular, relates to a light-emitting diode (LED) direct-view projection array light-emitting module and a display screen.

BACKGROUND

In current display or display screen products, images seen by human eyes can be divided into direct-view light of pixels and images formed by pixels after passing through optical devices. Simply speaking, direct view means that light from a light source directly reaches human eyes after passing through some structures of a display screen, such as a liquid crystal display (LCD), an organic light-emitting diode (OLED) smart watch, a notebook screen, a television and other product, and LED_surface mounted devices (LED-SMD) and LED_chip on board (LED_COB) large screens. However, LCD projection and DLP projection products are to image by displaying light from light sources on various media screens after passing through optical devices and then reflecting the light from the screens to enter human eyes.

Due to a preparation process that can reach a micron level, LCD and OLED in direct view may have high pixels per inch, which may reach a retina level (Pixels Per Inch (PPI) is about 300), and can be suitable for smart wearable products. However, both LCD and OLED can realize high pixels per inch and large pixel size. Therefore, LCD and OLED direct-view products are widely used in small-sized smart wearable screens of several inches (PPI of a retina screen is about 300), medium-sized computer screen displays of more than ten inches, and large-sized LCD televisions of dozens of inches. However, information on liquid crystal display screens of such products cannot be clearly seen at a long distance or in strong light backgrounds, and large screens over 100 inches cannot be produced by using such products.

The main reason why such products cannot be used in strong light backgrounds or outdoors is low brightness: LCD belongs to a non-autonomous luminous display technology whose principle is to use an electric field to change the deflection of an arrangement state of liquid crystal molecules to determine the amount of light emitted by white backlight sources, that is, red, green, and blue color filters on liquid crystal units selectively retain R, G, and B light, and finally these three RGB colors form color pixels. Since liquid crystal itself does not emit light, and the liquid crystal deflects and selectively emits light and has polarization, color filter and other structures, a final utilization rate of backlight sources in a system is extremely low, and light efficiency of the overall system is less than 10%. Low light efficiency makes the brightness of the overall liquid crystal screen low. Although OLED is self-luminous and has higher light efficiency than LCD, OLED is an inorganic light-emitting source into which too many electrons cannot be injected, otherwise it is very easy to burn the light source itself, so the brightness of the overall screen is still limited.

Screens over 100 inches cannot be made, because both LCD and OLED use a backplane drive process, and a large backplane technology is difficult to make screens of 100 inches now. If a plurality of small screens are spliced to form a screen over 100 inches, a frame of the LCD screen cannot be seamless.

To meet the market demand for large sizes, non-direct view projection products have emerged, which use an optical system to magnify light sources. At present, there are LCD technology projection and DLP technology projection in projection technologies. LCD projection is further divided into 3LCD and LCOS. DLP is to use a micro-array reflector chip Digital Micromirror Device (DMD) to pixelate white light sources under a driving action (each lens of the array reflector is deflected differently, which may be regarded as a different pixel), then perform filtering by using a RGB color wheel to form a color picture, and finally magnify and project the color picture onto a screen by using an optical system.

Projection systems using LCD as light sources, whether it is a single LCD system, an Liquid Crystal On Silicon (LCOS) light source system, or a 3LCD system, still do not have high light efficiency on backlight sources. Moreover, compared with LCD direct-view screens, projections are also magnified and imaged through an optical system, so that the brightness of such projection products is relatively lower and such projection products can only be used in indoor environments with lower brightness.

The Digital Light Processing (DLP) projection technology is to use white backlight sources to form pictures through the deflection of a DMD multi-array micro-reflector, and then forms a color picture by using a RGB color wheel, and finally magnify and image the color picture by using the optical system. Although a filtering effect of the color wheel may reduce light efficiency, DLP projection may use high-brightness LEDs, lasers or other devices as backlight sources to avoid excessive attenuation of light by a structure of a liquid crystal system, and its brightness is better than a projection system with LCD light sources to a certain extent, so the DLP projection technology is a current advanced display technology. In addition, DMD is only a device with a reflection function, and does not have any light-emitting function, so there are no small and medium-sized display products such as DMD-type smart wearables, computer screens, and televisions. Direct-view LED_Surface Mounted Device (LED_SMD) screens and LED_Chip-on-Board (LED_COB) screens are widely used in strong light environments indoors and outdoors, because LED is an inorganic light-emitting body with the characteristics of large current and high brightness. However, such screens belong to large splicing screens currently, and it is impossible to achieve high pixels per inch, which is limited by a spacing of LED beads or LED chips. The smaller the spacing, the more complicated the preparation process, and the larger the transfer amount, and the lower the yield. At present, LED direct-view screens are difficult to achieve a pixel spacing of 0.4 mm, that is, the pixels per inch (PPI) is difficult to reach 70, and are extremely difficult to be applied to small-sized high-definition display products.

SUMMARY

To achieve a color high-definition splicing LED screen with higher pixels per inch, high efficiency, and no splicing seams while considering a preparation process and costs, the present disclosure provides an LED direct-view projection array light-emitting module and a display screen.

A first objective of the present disclosure is to provide an LED direct-view projection array light-emitting module, where the light-emitting module includes a drive unit, display units, and an imaging unit; the display units display images on the imaging unit under the driving of a signal of the drive unit.

The drive unit is used to generate a drive signal according to an image or video to be displayed, and transmit the drive signal to the display units; each display unit includes three display sources and three corresponding optical magnification components, the three display sources are three monochromatic integrated LED array chips corresponding to R, G, and B colors respectively, each optical magnification component includes a magnification objective lens, the integrated LED array chips correspond to the magnification objective lenses one by one, and images formed by light emitted by the three display sources can overlap after being separately magnified by the three magnification objective lenses; the display unit drives the display sources to emit light under the action of the drive signal, the images formed by the light emitted by the display sources are magnified by the optical magnification components, and pixels per inch (PPI) of the magnified images can reach any numeral of 20 to 1000 through a combined action of the integrated LED array chips and the magnification objective lenses; and the imaging unit includes an imaging screen, the imaging unit is used to receive the images magnified by the display units and image on the imaging screen, and the thickness of the light-emitting module ranges from 5 mm to 100 mm.

Optionally, the drive unit is implemented by using a multi-layer printed circuit board (PCB), and the multi-layer PCB is provided with a corresponding video source decoding integrated circuit (IC) and a drive circuit.

The three integrated LED array chip of the display unit are integrated on the multi-layer PCB and connected to the drive circuit.

The optical magnification components are fixed on the multi-layer PCB, corresponding to the three integrated LED array chips of the display unit.

Optionally, the drive unit includes a video decoding drive board and a display unit drive board, the video decoding drive board is used to decode a video source to obtain a video decoded signal, and send the video decoded signal to the display unit drive board; and the display unit drive board is used to convert the decoded signal into an electrical signal that is used to drive the single display unit.

Optionally, the imaging unit further includes a light-transmitting board, the light-transmitting board is arranged between the display units and the imaging screen, and the light-transmitting board is provided with light-emitting areas corresponding to the display units, so that light passing through the magnification objective lenses is emitted from the light-emitting areas and projected onto the imaging screen, and the number of the light-emitting areas is the same as that of the display units.

Optionally, the light-transmitting board is black.

Optionally, a focusing lens array is further arranged in front of the light-transmitting board, a side of the light-transmitting board facing the focusing lens array is set into a suitable shape according to focusing lenses to achieve the effect of fixing the focusing lenses, and light passing through the magnification objective lens is shaped and collected by the focusing lens, and then emitted from the light-emitting area and projected onto the imaging screen.

Optionally, diffuse reflection treatment is performed on a surface of the imaging screen.

Optionally, focusing areas of the surface of the imaging screen are gray or black, and an area outside the focusing areas is black; and the focusing area is an area on the imaging screen corresponding to each light-emitting area.

Optionally, the video decoding drive board is provided with a video source decoding IC and a plurality of plug-in ports; the video source decoding IC decodes a video source to obtain a video decoded signal, and then send the video decoded signal to the corresponding display unit drive board through each plug-in port; and the video decoding drive board is electrically connected to the display unit drive board through a connector or a Flexible Printed Circuit (FPC) extension line.

Optionally, the video decoding drive board and the display unit drive board are circuit boards that are made of ultra-flat glass, glass fibers or BT resin substrates and provided with multi-layer circuits and drive ICs.

Optionally, the display unit further includes a display unit substrate, the integrated LED array chips are fixed on the display unit substrate through an insulating material, and the optical magnification component is fixed on the display unit substrate, corresponding to each integrated LED array chip.

The front of the display unit drive board is electrically connected to the display unit substrate in the display unit through a conductive material, and the back is provided with a plug-in port through which the display unit drive board is electrically connected to the video decoding drive board.

A second objective of the present disclosure is to provide an LED direct-view projection array light-emitting module that is different from the above structure, where the light-emitting module includes a drive unit, display units and an imaging unit; the display units display images on the imaging unit under the driving of a signal of the drive unit.

The drive unit is used to generate a drive signal according to an image or video to be displayed, and transmit the drive signal to the display units; each display unit includes three display sources and an optical magnification component, the three display sources are three monochromatic integrated LED array chips corresponding to R, G, and B colors respectively, the optical magnification component includes a three-in-one magnification objective lens and a corresponding objective lens fixing base, every three integrated LED array chips correspond to one three-in-one magnification objective lens, the display unit drives the display sources to emit light under the action of the drive signal, and magnifies and images display contents of the integrated LED array chips through the optical magnification component, images formed by light emitted by the three display sources can overlap after being magnified by the magnification objective lens, and pixels per inch (PPI) of the magnified images can reach any numeral of 20 to 1000 through a combined action of the integrated LED array chips and the magnification objective lens; and the imaging unit includes an imaging screen, the imaging unit is used to receive the images magnified by the display units and image on the imaging screen, and the thickness of the light-emitting module ranges from 5 mm to 100 mm.

Optionally, the drive unit is implemented by using a multi-layer printed circuit board (PCB), and the multi-layer PCB is provided with a corresponding video source decoding integrated circuit (IC) and a drive circuit.

The three integrated LED array chip of the display unit are integrated on the multi-layer PCB and connected to the drive circuit.

The optical magnification components are fixed on the multi-layer PCB, corresponding to the three integrated LED array chips of the display unit.

Optionally, the drive unit includes a video decoding drive board and a display unit drive board, the video decoding drive board is used to decode a video source to obtain a video decoded signal, and send the video decoded signal to the display unit drive board; and the display unit drive board is used to convert the decoded signal into an electrical signal that is used to drive the single display unit.

Optionally, the imaging unit further includes a light-transmitting board, the light-transmitting board is arranged between the display units and the imaging screen, and the light-transmitting board is provided with light-emitting areas corresponding to the display units, so that light passing through the three-in-one magnification objective lens is emitted from the light-emitting area and projected onto the imaging screen, and the number of the light-emitting areas is the same as that of the display units.

Optionally, the light-transmitting board is black.

Optionally, a focusing lens array is further arranged in front of the light-transmitting board, a side of the light-transmitting board facing the focusing lens array is set into a suitable shape according to focusing lenses to achieve the effect of fixing the focusing lenses, and light passing through the three-in-one magnification objective lens is shaped and collected by the focusing lenses, and then emitted from the light-emitting area and projected onto the imaging screen.

Optionally, diffuse reflection treatment is performed on a surface of the imaging screen.

Optionally, focusing areas of the surface of the imaging screen are gray or black, and an area outside the focusing areas is black; and the focusing area is an area on the imaging screen corresponding to each light-emitting area.

Optionally, the video decoding drive board is provided with a video source decoding IC and a plurality of plug-in ports; the video source decoding IC decodes a video source to obtain a video decoded signal, and then send the video decoded signal to the corresponding display unit drive board through each plug-in port; and the video decoding drive board is electrically connected to the display unit drive board through a connector or an FPC extension line.

Optionally, the video decoding drive board and the display unit drive board are circuit boards that are made of ultra-flat glass, glass fibers or BT resin substrates and provided with multi-layer circuits and drive ICs.

Optionally, the display unit further includes a display unit substrate, the integrated LED array chips are fixed on the display unit substrate through an insulating material, and the optical magnification component is fixed on the display unit substrate, corresponding to each integrated LED array chip.

The front of the display unit drive board is electrically connected to the display unit substrate in the display unit through a conductive material, and the back is provided with a plug-in port through which the display unit drive board is electrically connected to the video decoding drive board.

A third objective of the present disclosure is to provide a display screen, where the display screen is obtained by splicing a plurality of the above light-emitting modules.

Optionally, the display screen is formed into a flexible screen or a special-shaped screen by adjusting splicing angles between the light-emitting modules.

The present disclosure has the beneficial effects as follows:

The present disclosure uses a semiconductor technology to integrate and miniaturize light sources that emit light actively to obtain the LED integrated chips as light-emitting sources, directly controls the light-emitting sources through the circuit, then uses the magnification objective lenses to perform a certain magnification according to an application scenario requirement, and then forms the images on the imaging screen through the light-transmitting board; and by setting the integrated LED array chips corresponding to R, G, and B colors, the light-emitting module can display a color pattern. Furthermore, in the present disclosure, the focusing lens array is arranged in front of the light-transmitting board, and the focusing lens is used to focus on and image each pixel. Through the combination of the magnification lenses and the focusing lenses, when the light source intensity is sufficient, products of various sizes can be designed. At the same time, since the display sources in the light-emitting modules provided in the present disclosure adopt the integrated chips, pixels of the display screen are no longer limited by the spacing of LEDs. If the size of the integrated chip is 1*1 mm, the size of an internal light-emitting chip ranges from 5 microns to 100 microns. The spacing between the pixels of the finally splicing display screen of the present disclosure can easily reach 0.1 mm, and the corresponding PPI can reach 250. By selecting a suitable magnification, the PPI may range from 20 to 1000, but the pixels per inch (PPI) of the current LED direct-view screen is now difficult to reach 70.

Moreover, the size of each light-emitting module is much smaller than those of existing SMD and COB splicing blocks. Therefore, when splicing into a large screen, splicing angles can be adjusted arbitrarily to realize various products with no splicing frame size, even a special-shaped or flexible screen.

In addition, in the present application, the size design of the integrated chips cooperates with the optical magnification, so that the brightness can meet various application scenarios, that is, objective lenses with a smaller magnification are used to prepare a screen with a high brightness requirement, and objective lenses with a greater magnification are used to prepare a screen with a low brightness requirement. By selecting the magnification, screens that can meet the brightness requirements in various application scenarios are prepared.

Furthermore, the costs of integrated chips are lower than manufacturing costs of existing discrete LED chips, and cost advantages of high current density of LEDs can be fully utilized.

BRIEF DESCRIPTION OF THE DRAWINGS

To describe the technical solutions in the embodiments of the present disclosure more clearly, the following will briefly introduce the accompanying drawings required for describing the embodiments. Obviously, the accompanying drawings in the following description show merely some embodiments of the present disclosure, and for those of ordinary skill in the art, without paying creative labor, other accompanying drawings may be obtained based on these accompanying drawings.

DETAILED DESCRIPTION OF THE EMBODIMENTS

At present, small-spacing LED screens include surface mounted devices (SMD) screens and chip on board (COB) screens. The SMD screen encapsulates three RGB LED chips in a lamp bead which is patched and encapsulated on a PCB, and the COB screen directly encapsulates three RGB LED chips on a PCB. Therefore, at present, the SMD screen can achieve a pixel spacing of P1.25, and corresponding pixels per inch (PPI, the number of pixels that can be arranged per inch) is 25.4/1.25=20.32. The COB screen can achieve a pixel spacing of P0.6, and the corresponding PPI is 42.33. PPI of a liquid crystal display screen is inversely proportional to its screen size. The larger the screen, the smaller the PPI. Usually, for a 55-inch liquid crystal display screen, PPI of a 4K resolution can reach 84, and PPI of an 8K resolution can reach 160. It can be seen that although the spacing of the small-spacing LEDs is small enough, it still cannot reach the high-definition level of the liquid crystal display screen.

In the present disclosure, LED integrated chips are used, then magnification is performed by magnification objective lenses and focusing is performed by focusing lenses, and finally images are formed on an imaging screen. By adjusting the magnification of the magnification objective lenses and the size of LED arrays on the LED integrated chips, the minimum PPI can reach 847, which is described as follows:

If a magnification of the magnification objective lens is 1, and the spacing between the LED chips in the LED array on the LED integrated chip is 30 microns, the PPI is 25.4*1000 mm/30=847.

By selecting magnification objective lenses with other magnifications and integrated chips with other LED array sizes, screens with higher PPI values can be prepared according to the solution of the present disclosure.

The selection of magnification objective lenses with a specific magnification can be determined according to a brightness requirement of a final screen.

To make the objectives, technical solutions, and advantages of the present disclosure clearer, the solutions of the present disclosure are further described in detail below in conjunction with the accompanying drawings.

Embodiment 1

Figure 1:
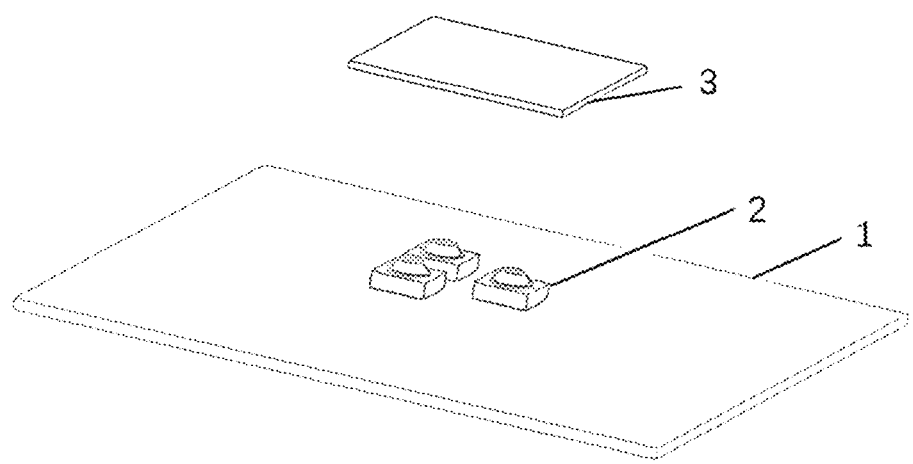
FIG. 1 is an overall schematic diagram of a light-emitting module according to an embodiment of the present disclosure.

This embodiment provides an LED direct-view projection array light-emitting module. Referring to FIG. 1, the light-emitting module includes: a drive unit 1, display units 2 and an imaging unit 3. The display units 2 display images on the imaging unit 3 under the driving of a signal of the drive unit 1, where each display unit 2 includes three display sources and three optical magnification components, and the three display sources are three monochromatic integrated LED array chips corresponding to R, G and B colors respectively. Each optical magnification component includes a magnification objective lens and a corresponding objective lens fixing base. By adjusting installation angles of the three optical magnification components, images formed by light emitted by the three display sources can overlap on an imaging screen after being separately magnified by the three magnification objective lenses. Pixels per inch (PPI) of the magnified images can reach any numeral of 20 to 1000 through a combined action of the integrated LED array chips and the magnification objective lenses.

In practical applications, the drive unit 1 may be implemented in two ways: in one implementation, the drive unit 1 may be implemented by using a multi-layer PCB, and in the other implementation, the drive unit 1 is implemented by using a video decoding drive board and a display unit drive board. The following introduces these two implementations in embodiment 2 and embodiment 3 separately:

Embodiment 2

Figure 2:
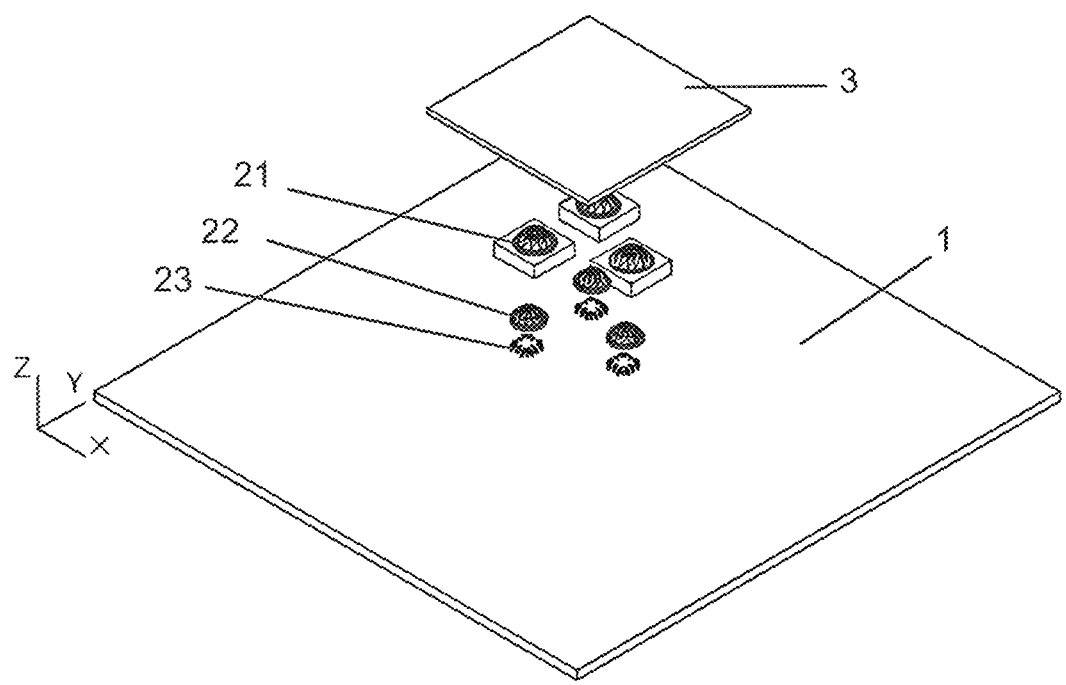
FIG. 2 is an exploded view of a light-emitting module according to an embodiment of the present disclosure when a multi-layer PCB is used to implement a drive unit.

This embodiment provides an LED direct-view projection array light-emitting module. Referring to FIG. 2, the light-emitting module includes a drive unit 1, display units 2 and an imaging unit 3. The display units 2 display images on the imaging unit 3 under the driving of a signal of the drive unit 1.

The drive unit 1 is implemented by using a multi-layer PCB, and the multi-layer PCB is provided with a corresponding video source decoding IC and a drive circuit.

The display unit 2 includes three display sources 23 and three corresponding optical magnification components. The three display sources 23 are three monochromatic integrated LED array chips corresponding to R, G and B colors respectively. Each optical magnification component includes a magnification objective lens 22 and a corresponding objective lens fixing base 21. The integrated LED array chips correspond to the magnification objective lenses one by one, that is, each integrated LED array chip uses one magnification objective lens to magnify and image its display content.

The integrated LED array chips as the display sources 23 are integrated on the multi-layer PCB and connected to the drive circuit, and emit light under the driving of an electrical signal of the drive circuit. Each light-emitting point in the integrated LED array chip can emit light independently under the driving of the electrical signal. Specifically, after the display sources 23 are welded onto the multi-layer PCB through welding wires or through holes, the objective lens fixing bases 21 are fixed on the multi-layer PCB through an adhesive material such as glue. The objective lens fixing base 21 is of a structure adapted to the shape of the magnification objective lens. The objective lens fixing base 21 clamps and fixes the magnification objective lens 22 on the display source 23. A light-emitting area is formed above the objective lens fixing base 21. Light emitted by the display source 23 is emitted from the light-emitting area after passing through the magnification objective lens. A housing of the objective fixing base 21 is black, which not only protects the objective lens, but also prevents the interference of stray light from affecting the imaging.

It should be noted that the objective lens fixing bases 21 may correspond to the magnification objective lenses 22 one by one, that is, one magnification objective lens 22 corresponds to one objective lens fixing base 21; or, every three magnification objective lenses 22 (that is, magnification objective lenses corresponding to R color, G color, and B color integrated LED array chips respectively) correspond to one objective lens fixing base 21. In practical applications, all objective lens fixing bases 21 can be integrally prepared according to requirements of a preparation process, or the corresponding relationship between the objective lens fixing bases 21 and the magnification objective lenses 22 can be determined according to the size of a final spliced screen.

Embodiment 3

Figure 3:
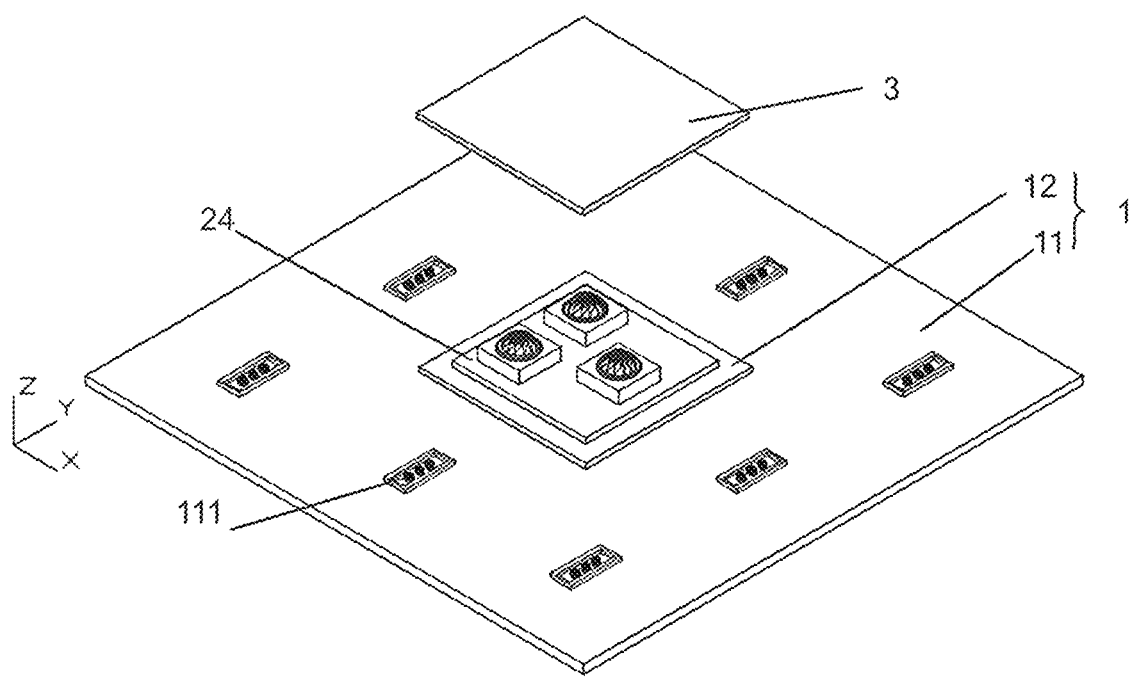
FIG. 3 is an overall schematic diagram according to an embodiment of the present disclosure when a combination of a video decoding drive board and a display unit drive board is used to implement a drive unit.

This embodiment provides an LED direct-view projection array light-emitting module. Referring to FIG. 3, the light-emitting module includes a drive unit 1, display units 2 and an imaging unit 3. The display units 2 display images on the imaging unit 3 under the driving of a signal of the drive unit 1.

The drive unit 1 is implemented by using a video decoding drive board 11 and a display unit drive board 12. The video decoding drive board 11 is used to decode a video source to obtain a video decoded signal, and sends the video decoded signal to the display unit drive board 12. The display unit drive board 12 is used to convert the decoded signal into an electrical signal used to drive the single display unit, that is, a drive signal. Each light-emitting point in the integrated LED array chip can emit light independently under the driving of the electrical signal.

The video decoding drive board 11 and the display unit drive board 12 may be circuit boards that are made of ultra-flat glass, glass fibers or BT resin substrates and provided with multi-layer circuits and drive ICs.

As shown in FIG. 3, in addition to display sources 23 and an optical magnification component (the optical magnification component includes three magnification objective lenses 22 and corresponding objective lens fixing bases 21), the display unit 2 further includes a display unit substrate 24. Three integrated LED array chips as the display sources 23 are welded onto the display unit substrate 24 through welding wires (in FIG. 3, the display sources 23 and the optical magnification component are not explosively displayed). The front of the display unit drive board 12 is electrically connected to the display unit substrate 24 through a conductive material, and the back is provided with a plug-in port through which the display unit drive board is electrically connected to a corresponding plug-in port 111 on the video decoding drive board 11.

Usually, the conductive material may be solder paste, silver glue, etc.

Figure 4:
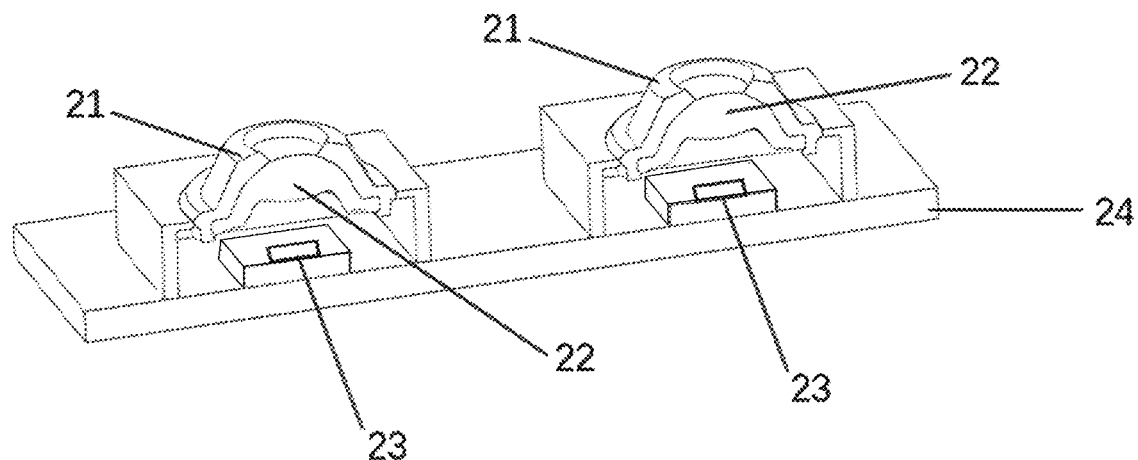
FIG. 4 is a cross-sectional view of a display unit in a light-emitting module according to an embodiment of the present disclosure.

The objective lens fixing base 21 is also fixed on the display unit substrate 24 through an adhesive material such as glue. As shown in FIG. 4, the objective lens fixing base 21 is of a structure adapted to the shape of the magnification objective lens 22. The objective lens fixing base 21 clamps and fixes the magnification objective lens 22 on the display source 23. A light-emitting area is arranged above the objective lens fixing base 21. Light emitted by the three integrated LED array chips as the display sources 23 are emitted from the light-emitting areas after passing through the magnification objective lenses. A housing of the objective fixing base 21 is black, which not only protects the objective lens, but also prevents the interference of stray light from affecting the imaging.

It should be noted that in practical applications, the integrated LED array chips corresponding to R, G, and B colors are arranged in a triangle, so a cross-sectional view of the display unit provided in FIG. 4 only includes two integrated LED array chips and corresponding magnification modules.

Embodiment 4

This embodiment provides an LED direct-view projection array light-emitting module. This embodiment further improves the implementation of the imaging unit 3 based on the light-emitting module provided in embodiment 3.

Figure 5:
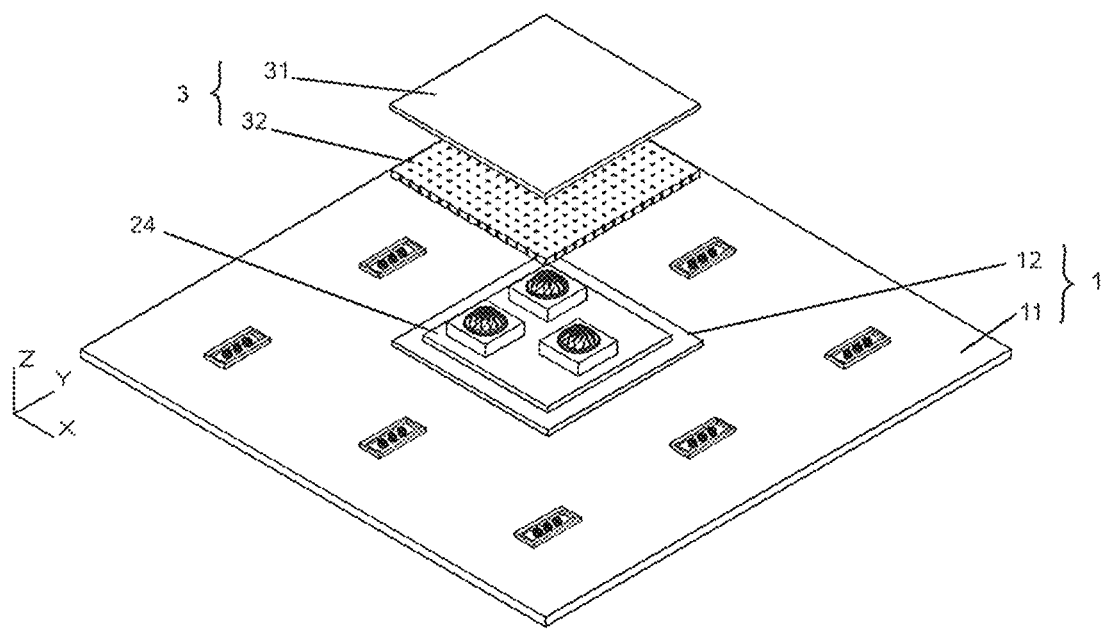
FIG. 5 is a schematic diagram of a light-emitting module according to an embodiment of the present disclosure when an imaging unit includes an imaging screen and a light-transmitting board.

Since a preparation process of the monochromatic integrated LED array chip is more mature at present, based on the requirement of realizing a color splicing screen, this embodiment provides an LED direct-view projection array light-emitting module. As shown in FIG. 5, the light-emitting module includes: a drive unit 1, display units 2 and an imaging unit 3. The display units 2 display images on the imaging unit 3 under the driving of a signal of the drive unit 1.

The drive unit 1 is used to generate a drive signal according to an image or video to be displayed, and transmit the drive signal to the display units. Each display unit 2 includes three display sources 23 and three corresponding optical magnification components. The three display sources 23 are three monochromatic integrated LED array chips corresponding to R, G and B colors respectively. Each optical magnification component includes a magnification objective lens 22 and a corresponding objective lens fixing base 21. The integrated LED array chips correspond to the magnification objective lenses one by one, that is, each integrated LED array chip uses one magnification objective lens to magnify and image its display content.

The display unit 2 drives the three display sources 23 to emit light correspondingly under the action of the drive signal, and magnifies and images the display contents of the integrated LED array chips by using the optical magnification components. By adjusting installation angles of the three optical magnification components, images formed by light emitted by the three display sources can overlap on an imaging screen 31 after being separately magnified by the three magnification objective lenses.

It should be noted that to ensure that the magnification objective lens 22 can magnify and image the display content of the integrated LED array chip on the imaging screen 31, the integrated LED array chip needs to be arranged within the range of 1-2 times a focal length of the magnification objective lens 22.

As shown in FIG. 5, the drive unit 1 is implemented by using a video decoding drive board 11 and a display unit drive board 12. The video decoding drive board 11 is used to decode a video source to obtain a video decoded signal, and send the video decoded signal to the display unit drive board 12. The display unit drive board 12 is used to convert the decoded signal into an electrical signal used to drive the single display unit, that is, a drive signal. The video decoding drive board 11 and the display unit drive board 12 may be circuit boards that are made of ultra-flat glass, glass fibers or BT resin substrates and provided with multi-layer circuits and drive ICs.

As shown in FIG. 5, in addition to display sources 23 and an optical magnification component (the optical magnification component includes three magnification objective lenses 22 and corresponding objective lens fixing bases 21), the display unit 2 further includes a display unit substrate 24. Three integrated LED array chips as the display sources 23 are welded onto the display unit substrate 24 through welding wires (in FIG. 5, the display sources 23 and the optical magnification component are not explosively displayed). The front of the display unit drive board 12 is electrically connected to the display unit substrate 24 through a conductive material, and the back is provided with a plug-in port through which the display unit drive board is electrically connected to a corresponding plug-in port 111 on the video decoding drive board 11.

The objective lens fixing base 21 is also fixed on the display unit substrate 24 through an adhesive material such as glue. The objective lens fixing base 21 is of a structure adapted to the shape of the magnification objective lens 22. The objective lens fixing base 21 clamps and fixes the magnification objective lens 22 on the display source 23. A light-emitting area is arranged above the objective lens fixing base 21. Light emitted by the three integrated LED array chips as the display sources 23 are emitted from the light-emitting areas after passing through the magnification objective lenses. A housing of the objective fixing base 21 is black, which not only protects the objective lens, but also prevents the interference of stray light from affecting the imaging.

Diffuse reflection treatment is performed on a surface of the imaging screen 31. A color of the imaging screen 31 is determined according to a contrast to be achieved. Usually, to achieve a high contrast of final imaging, positions on the imaging screen 31 corresponding to the light-emitting areas of the objective lens fixing bases 21 may be gray or black, and the other area is black, thereby improving the display contrast. If a contrast requirement of final imaging is not high, the color of the imaging screen 31 may also be set to other color. In practical applications, the imaging screen 31 may be made of a transparent or semi-transparent material such as glass, plastic, or resin.

Figure 6:
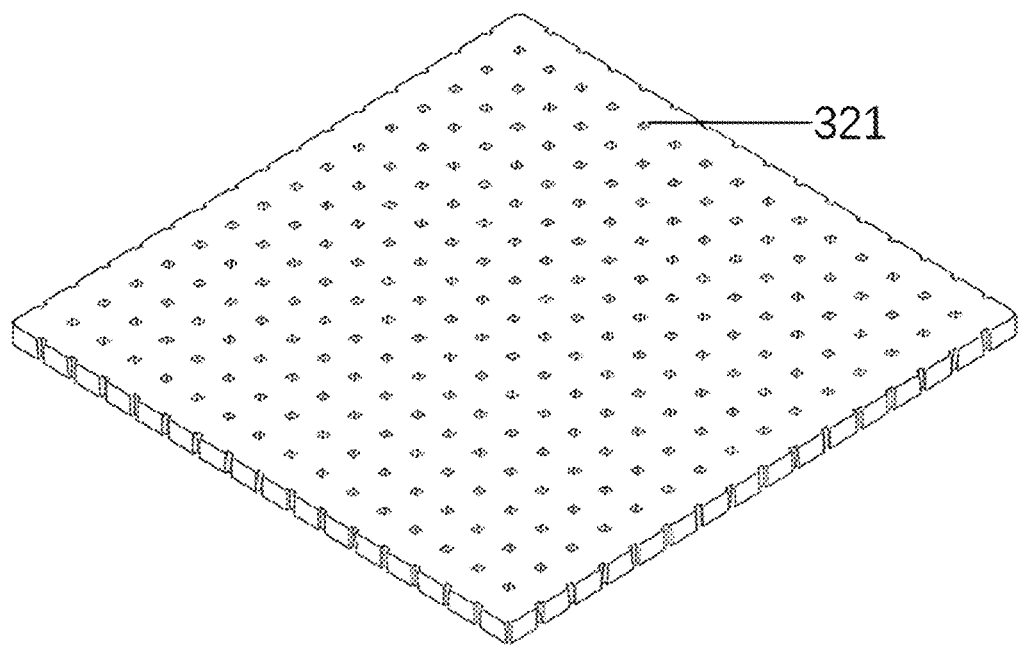
FIG. 6 is a stereoscopic view of a light-transmitting board in an imaging unit of a light-emitting module according to an embodiment of the present disclosure.

If the imaging screen 31 is made of a material with no support force such as plastic, to improve a support force of the screen, a light-transmitting board can be additionally arranged to improve the support force of the screen. As shown in FIG. 5, in an implementation, the imaging unit 3 further includes a light-transmitting board 32, and the light-transmitting board 32 is arranged between the display units 2 and the imaging screen 31. As shown in FIG. 6, the light-transmitting board 32 is provided with light-emitting areas 321 of a certain size corresponding to the display units 2, so that light passing through the magnification objective lens is emitted from the light-emitting area and projected onto the imaging screen. The number of the light-emitting areas is the same as that of the display units. The light-transmitting board 32 may be made of a transparent or non-transparent material. If the light-transmitting board 32 is made of the non-transparent material, the light-emitting areas 321 may be implemented by opening holes, and meanwhile, considering a high contrast of final imaging, a non-opening area may be blackened. If the light-transmitting board 32 is made of the transparent material, the light-emitting areas 321 may be implemented by coloring or other methods, that is, an area outside the light-emitting areas 321 is blackened or blocked.

Figure 7:
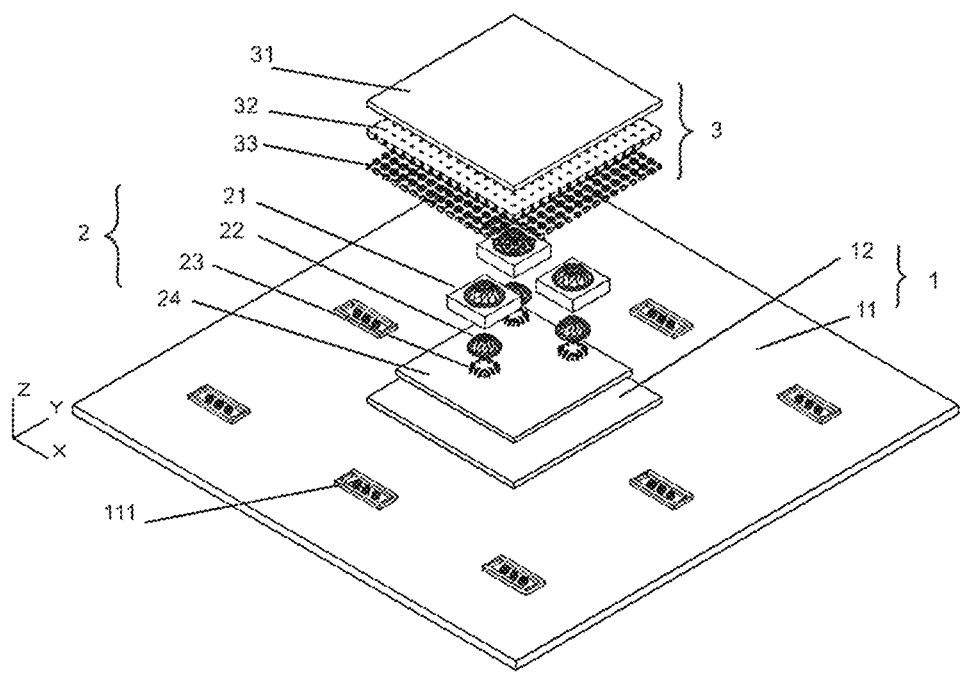
FIG. 7 is an exploded view of a light-emitting module according to an embodiment of the present disclosure when an imaging unit includes an imaging screen, a light-transmitting board and a focusing lens array.

To further improve a utilization rate of light, as shown in FIG. 7, in an implementation, the imaging unit 3 further includes a focusing lens array 33. A side of the light-transmitting board 32 facing the focusing lens array 33 is set into a suitable shape according to focusing lenses to achieve the function of fixing the focusing lenses. Light passing through the magnification objective lens 22 is shaped and collected by the focusing lens, and then emitted from the light-emitting area and projected onto the imaging screen 31.

In practical applications, focusing areas on the surface of the imaging screen 31 are gray or black, and an area outside the focusing areas is black. The focusing areas are areas on the imaging screen corresponding to the light-emitting areas.

In practical applications, the corresponding relationship between the display unit drive board 12 and the display unit 2 may be one-to-many or one-to-one. The corresponding relationship between the display unit 2 and the imaging unit 3 may be one-to-many or one-to-one. Usually, the imaging unit 3 may correspond to a splicing unit formed by a plurality of display units 2. The number of the focusing lenses in the focusing lens array 33 in the imaging unit 3 is the same as that of pixels of display sources 23 in all corresponding display units 2, that is, an electrical signal of each pixel comes out from one light-transmitting hole and is imaged on the screen.

Figure 8:
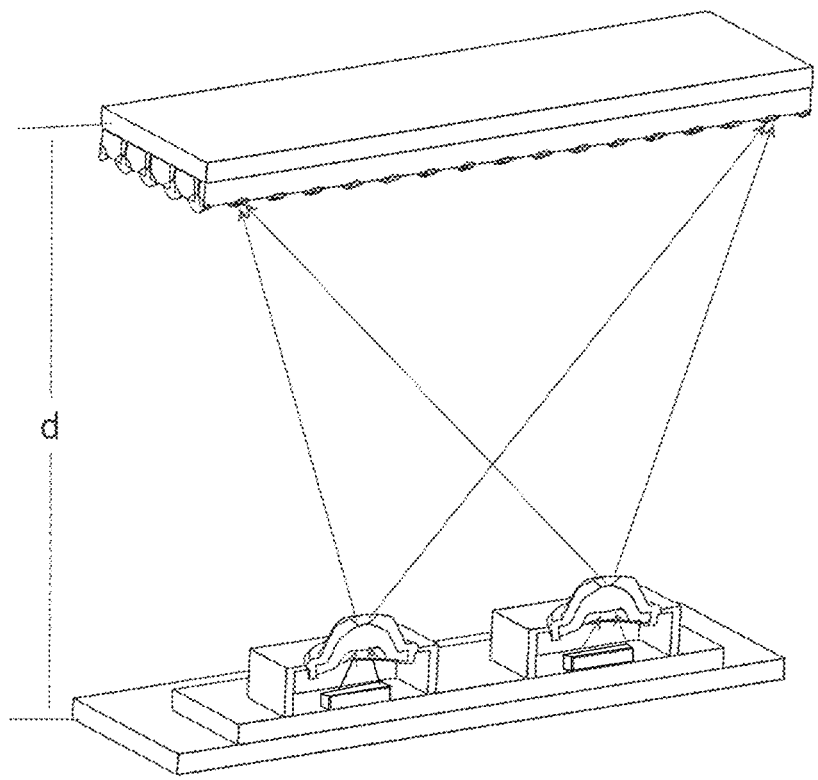
FIG. 8 is an overall cross-sectional view of a light-emitting module according to an embodiment of the present disclosure.

As shown in FIG. 8, it is a schematic diagram that images formed by light emitted by three integrated LED array chips, corresponding to R, G, and B colors respectively, in the single display unit are magnified several times by the optical magnification components, and then shaped and collected by the focusing lens array to form pixel spots. The surface of the imaging screen 31 is treated to facilitate diffuse emission of light, thereby improving a viewing angle.

Based on the light-emitting module provided in this embodiment, a splicing screen of any size can be realized. The thickness d of the light-emitting module of the present disclosure is determined according to the focal length of the magnification objective lens. Usually, the overall thickness ranges from 5 mm to 100 mm. When preparing a display screen, relative to the thickness of a support structure of the screen, the thickness d, which is usually between a few millimeters and tens of millimeters, of the light-emitting module can be ignored. Therefore, even if the light-emitting module of the present disclosure has a certain thickness due to the use of magnification objective lenses, the thickness of the screen finally prepared is not increased.

A large screen is obtained by splicing a plurality of light-emitting modules. If a special-shaped screen is to be prepared, considering that if a single splicing unit is too large, its splicing angle is limited, an imaging unit 3 of a suitable size can be designed, and even the display units 2 correspond to the imaging units 3 one by one.

Embodiment 5

Figure 9:
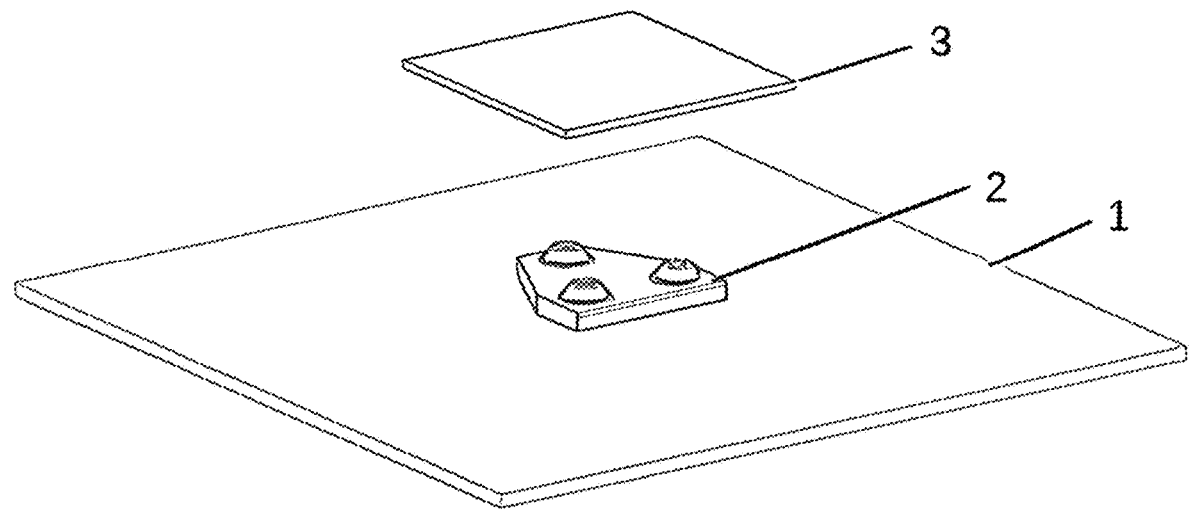
FIG. 9 is an overall schematic diagram of a light-emitting module of another structure according to an embodiment of the present disclosure.

This embodiment provides an LED direct-view projection array light-emitting module, which differs from the light-emitting modules provided in the above embodiment 1 to embodiment 4 in that in the light-emitting module provided in this embodiment, each display unit includes three display sources and an optical magnification component. The three display sources are three monochromatic integrated LED array chips corresponding to R, G, and B colors respectively. The optical magnification component includes a three-in-one magnification objective lens and a corresponding objective lens fixing base. That is, the three magnification objective lenses corresponding to the three display sources in the above embodiment are implemented by using the three-in-one magnification objective lens, as shown in FIG. 9.

Figure 10:
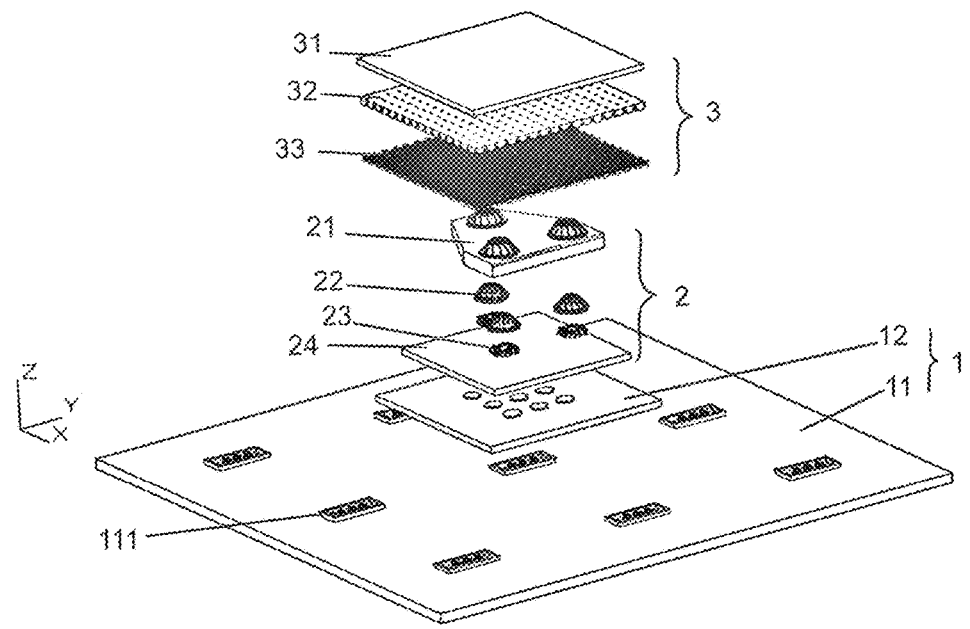
FIG. 10 is an exploded view of a light-emitting module of another structure according to an embodiment of the present disclosure.

Similarly, the drive unit 1 may be implemented in two ways: in one implementation, the drive unit 1 may be implemented by using a multi-layer PCB, and in the other implementation, the drive unit 1 is implemented by using a video decoding drive board and a display unit drive board. The following is an example of the drive unit 1 being implemented by using a video decoding drive board 11 and a display unit drive board 12:

As shown in FIG. 10, the drive unit 1 is used to generate a drive signal according to an image or video to be displayed, and transmit the drive signal to the display units. Each display unit 2 includes three display sources 23 and an optical magnification component. The three display sources 23 are three monochromatic integrated LED array chips corresponding to R, G, and B colors respectively. The optical magnification component includes a three-in-one magnification objective lens 22 and a corresponding objective lens fixing base 21. Images formed by light emitted by the three display sources 23 can overlap after being magnified by the three-in-one magnification objective lens. The display unit 2 drives the display sources 23 to emit light under the action of the drive signal, and magnifies and images display contents of the integrated LED array chips through the optical magnification component. The imaging unit 3 includes an imaging screen 31. The imaging unit 3 is used to receive the images magnified by the display units 2 and image on the imaging screen 31.

Similarly, to ensure that the three-in-one magnification objective lens 22 can magnify and image the display contents of the integrated LED array chips on the imaging screen 31, the integrated LED array chips need to be arranged within the range of 1-2 times a focal length of the three-in-one magnification objective lens 22.

As shown in FIG. 10, the drive unit 1 is implemented by using a video decoding drive board 11 and a display unit drive board 12. The video decoding drive board 11 is used to decode a video source to obtain a video decoded signal, and send the video decoded signal to the display unit drive board 12. The display unit drive board 12 is used to convert the decoded signal into an electrical signal used to drive the single display unit, that is, a drive signal. The video decoding drive board 11 and the display unit drive board 12 may be circuit boards that are made of ultra-flat glass, glass fibers or BT resin substrates and provided with multi-layer circuits and drive ICs.

As shown in FIG. 10, in addition to the display sources 23 and the optical magnification component (the optical magnification component includes the three-in-one magnification objective lens 22 and the objective lens fixing base 21), the display unit 2 further includes a display unit substrate 24. The integrated LED array chips as the display sources 23 are welded onto the display unit substrate 24 through welding wires. The front of the display unit drive board 12 is electrically connected to the display unit substrate 24 through a conductive material, and the back is provided with a plug-in port through which the display unit drive board is electrically connected to a corresponding plug-in port 111 on the video decoding drive board 11.

The objective lens fixing base 21 is also fixed on the display unit substrate 24 through an adhesive material such as glue. The objective lens fixing base 21 is of a structure adapted to the shape of the three-in-one magnification objective lens 22. The objective lens fixing base 21 clamps and fixes the three-in-one magnification objective lens 22 on the display sources 23. A light-emitting area is arranged above the objective lens fixing base 21. Light emitted by the display sources 23 are emitted from the light-emitting area after passing through the three-in-one magnification objective lens. A housing of the objective fixing base 21 is black, which not only protects the objective lens, but also prevents the interference of stray light from affecting the imaging.

Since the lens size in the present disclosure is at the millimeter level, it is difficult to prepare three-in-one objective lenses currently available on the market. Therefore, FIG. 9 and FIG. 10 of the present disclosure use an example of a three-in-one magnification objective lens in which three objective lenses are embedded in an objective lens fixing base for illustration. The objective lens fixing base limits angles of the three objective lenses accordingly, so that the images formed by the light emitted by the three display sources overlap on the imaging screen 31.

Diffuse reflection treatment is performed on a surface of the imaging screen 31. A color of the imaging screen 31 is determined according to a contrast to be achieved. Usually, to achieve a high contrast of final imaging, positions on the imaging screen 31 corresponding to the light-emitting areas of the objective lens fixing bases 21 may be gray or black, and the other area is black, thereby improving the display contrast. If a contrast requirement of final imaging is not high, the color of the imaging screen 31 may also be set to other color. In practical applications, the imaging screen 31 may be made of a transparent or semi-transparent material such as glass, plastic, or resin.

If the imaging screen 31 is made of a material with no support force such as plastic, to improve a support force of the screen, a light-transmitting board can be additionally arranged to improve the support force of the screen. As shown in FIG. 5, in an implementation, the imaging unit 3 further includes a light-transmitting board 32, and the light-transmitting board 32 is arranged between the display units 2 and the imaging screen 31. Referring to FIG. 6 that corresponds to embodiment 1, the light-transmitting board 32 is provided with light-emitting areas 321 of a certain size corresponding to the display units 2, so that light passing through the magnification objective lens is emitted from the light-emitting area and projected onto the imaging screen. The number of the light-emitting areas is the same as that of the display units. The light-transmitting board 32 may be made of a transparent or non-transparent material. If the light-transmitting board 32 is made of the non-transparent material, the light-emitting areas 321 may be implemented by opening holes, and meanwhile, considering a high contrast of final imaging, a non-opening area can be blackened. If the light-transmitting board 32 is made of the transparent material, the light-emitting areas 321 may be implemented by coloring or other methods, that is, an area outside the light-emitting areas 321 is blackened or blocked.

To further improve a utilization rate of light, referring to FIG. 7 that corresponds to embodiment 4, in an implementation, the imaging unit 3 further includes a focusing lens array 33. A side of the light-transmitting board 32 facing the focusing lens array 33 is set into a suitable shape according to focusing lenses to achieve the function of fixing the focusing lenses. Light passing through the magnification objective lens 22 is shaped and collected by the focusing lens, and then emitted from the light-emitting area and projected onto the imaging screen 31.

In practical applications, focusing areas on the surface of the imaging screen 31 are gray or black, and an area outside the focusing areas is black. The focusing areas are areas on the imaging screen corresponding to the light-emitting areas.

In practical applications, the corresponding relationship between the display unit drive board 12 and the display unit 2 may be one-to-many or one-to-one. The corresponding relationship between the display unit 2 and the imaging unit 3 may be one-to-many or one-to-one. Usually, the imaging unit 3 may correspond to a splicing unit formed by a plurality of display units 2. The number of the focusing lenses in the focusing lens array 33 of the imaging unit 3 is the same as that of pixels of display sources 23 in all corresponding display units 2, that is, an electrical signal of each pixel comes out from one light-transmitting hole, and is imaged on the screen.

As shown in FIG. 8, it is a schematic diagram that images formed by light emitted by three integrated LED array chips, corresponding to R, G, and B colors respectively, in the single display unit are magnified several times by the optical magnification components, and then shaped and collected by the focusing lens array to form pixel spots. The surface of the imaging screen 31 is treated to facilitate diffuse emission of light, thereby improving a viewing angle.

Based on the light-emitting module provided in this embodiment, a splicing screen of any size can be realized. The thickness d of the light-emitting module of the present disclosure is determined according to a focal length of the magnification objective lens. When preparing a display screen, relative to the thickness of a support structure of the screen, the thickness d, which is usually between a few millimeters and tens of millimeters, of the light-emitting module can be ignored. Therefore, even if the light-emitting module of the present disclosure has a certain thickness due to the use of magnification objective lenses, the thickness of the screen finally prepared is not increased.

A large screen is obtained by splicing a plurality of light-emitting modules. If a special-shaped screen is to be prepared, considering that if a single splicing unit is too large, its splicing angle is limited, an imaging unit 3 of a suitable size can be designed, and even the display units 2 correspond to the imaging units 3 one by one.

Embodiment 6

This embodiment provides a display screen, which is obtained by splicing a plurality of LED direct-view projection array light-emitting modules provided in the above embodiment. A flexible screen or a special-shaped screen is obtained by adjusting splicing angles between the light-emitting modules.

Since the display source in the light-emitting module adopts an integrated LED array chip, when achieving a same pixel resolution, the number of integrated LED array chips required is much less than the number of single LED chips, thereby reducing assembly time of the screen and reducing production costs. By selecting a magnification of the magnification objective lens, screens suitable for different brightness requirements may be further obtained.

For example, assuming that the display source 23 adopts a 20×20 monochromatic LED array chip, if a pixel resolution of 2000*1000 is to be obtained, it is necessary to combine 100*50 array light sources. In the prior art, for a monochromatic LED_COB screen with a resolution of 2000*1000, 2 k*1 k LED chips need to be transferred to a PCB, but in the present disclosure, only 100*50 array chips need to be transferred, and the transfer amount is 400 times different. Therefore, in terms of preparation process, the solution of the present disclosure is easier to implement.

In addition, the size of each light-emitting module in the present disclosure is much smaller than those of existing SMD and COB splicing blocks. Therefore, when splicing into a large screen, splicing angles can be adjusted arbitrarily to realize a flexible screen or a special-shaped screen.

Some steps in the embodiments of the present disclosure may be implemented by software, and a corresponding software program may be stored in a readable storage medium, such as an optical disc or a hard disk.

The above are only preferred embodiments of the present disclosure and are not intended to limit the present disclosure. Any modification, equivalent replacement, improvement, etc. made within the spirit and principle of the present disclosure should be included in the protection scope of the present disclosure.

What is claimed is:

1. A light-emitting diode (LED) direct-view projection array light-emitting module, comprising a drive unit, display units, and an imaging unit; wherein
    the display units display images on the imaging unit under the driving of a signal of the drive unit;
    the drive unit is used to generate a drive signal according to an image or video to be displayed, and transmit the drive signal to the display units;
    each of the display units comprises three display sources and three corresponding optical magnification components, the three display sources are three monochromatic integrated LED array chips corresponding to R, G, and B colors respectively, each optical magnification component comprises a magnification objective lens and a corresponding objective lens fixing base, the integrated LED array chips correspond to the magnification objective lenses one by one, and by adjusting installation angles of the three optical magnification components, images formed by light emitted by the three display sources are capable of overlapping after being separately magnified by the three magnification objective lens;
    a display unit drives the display sources to emit light under the action of the drive signal, and the images formed by the light emitted by the display sources are magnified by the optical magnification components;
    the imaging unit comprises an imaging screen, the imaging unit is used to receive the images magnified by the display units and image on the imaging screen; and
    the thickness of the light-emitting module ranges from 5 mm to 100 mm.

2. The light-emitting module according to claim 1, wherein the drive unit is implemented by using a multi-layer printed circuit board (PCB), and the multi-layer PCB is provided with a corresponding video source decoding IC and a drive circuit; the three integrated LED array chips of the display unit are integrated on the multi-layer PCB and connected to the drive unit; and the optical magnification components are fixed on the multi-layer PCB, corresponding to the three LED integrated array chips of the display unit.

3. The light-emitting module according to claim 1, wherein the drive unit comprises a video decoding drive board and a display unit drive board, the video decoding drive board is used to decode a video source to obtain a video decoded signal, and send the video decoded signal to the display unit drive board; and the display unit drive board is used to convert the decoded signal into an electrical signal that is used to drive the single display unit.

4. The light-emitting module according to claim 1, wherein the imaging unit further comprises a light-transmitting board, the light-transmitting board is arranged between the display units and the imaging screen, and the light-transmitting board is provided with light-emitting areas corresponding to the display units, so that light passing through the magnification objective lens is emitted from the light-emitting area and projected onto the imaging screen, and the number of the light-emitting areas is the same as that of the display units.

5. The light-emitting module according to claim 4, wherein a focusing lens array is further arranged in front of the light-transmitting board, a side of the light-transmitting board facing the focusing lens array is set into a suitable shape according to focusing lenses to achieve the effect of fixing the focusing lenses, and light passing through the magnification objective lens is shaped and collected by the focusing lens, and then emitted from the light-emitting area and projected onto the imaging screen.

6. The light-emitting module according to claim 4, wherein diffuse reflection treatment is performed on a surface of the imaging screen.

7. The light-emitting module according to claim 3, wherein the video decoding drive board is provided with a video source decoding integrated circuit (IC) and a plurality of plug-in ports; the video source decoding IC decodes a video source to obtain a video decoded signal, and then send the video decoded signal to the corresponding display unit drive board through each plug-in port; and the video decoding drive board is electrically connected to the display unit drive board through a connector or a Flexible Printed Circuit (FPC) extension line.

8. The light-emitting module according to claim 7, wherein the video decoding drive board and the display unit drive board are circuit boards that are made of ultra-flat glass, glass fibers or BT resin substrates and provided with multi-layer circuits and drive ICs.

9. The light-emitting module according to claim 8, wherein the display unit further comprises a display unit substrate, the integrated LED array chips are fixed on the display unit substrate through an insulating material, and the optical magnification component is fixed on the display unit substrate, corresponding to each integrated LED array chip; the front of the display unit drive board is electrically connected to the display unit substrate in the display unit through a conductive material, and the back is provided with a plug-in port through which the display unit drive board is electrically connected to the video decoding drive board.

* * * * *